(12) United States Patent
Jiwari et al.

(10) Patent No.: US 6,518,169 B1
(45) Date of Patent: Feb. 11, 2003

(54) SEMICONDUCTOR DEVICE AND METHOD FOR FABRICATING THE SAME

(75) Inventors: Nobuhiro Jiwari, Osaka (JP); Shinichi Imai, Osaka (JP)

(73) Assignee: Matsushita Electric Industrial co., Ltd., Osaka (JP)

( * ) Notice: Subject to any disclaimer, the term of this patent is extended or adjusted under 35 U.S.C. 154(b) by 63 days.

(21) Appl. No.: 09/708,082

(22) Filed: Nov. 8, 2000

(30) Foreign Application Priority Data

Nov. 12, 1999 (JP) .......................................... 11-319092

(51) Int. Cl.$^7$ .......................................... H01L 21/4763
(52) U.S. Cl. ...................... 438/623; 438/622; 438/624; 438/778; 438/780; 438/781; 438/790
(58) Field of Search ................................ 438/622, 623, 438/624, 778, 780, 781, 790

(56) References Cited

U.S. PATENT DOCUMENTS 5,721,285 A * 2/1998 Nakamoto et al. .......... 521/131

6,316,349 B1 * 11/2001 Kim et al. .................. 438/637

FOREIGN PATENT DOCUMENTS

JP          10-233448          9/1998

* cited by examiner

*Primary Examiner*—David L. Talbott
*Assistant Examiner*—David A. Zarneke
(74) *Attorney, Agent, or Firm*—Nixon Peabody LLP; Donald R. Studebaker

(57) ABSTRACT

A plurality of metal interconnections are formed on a semiconductor substrate. The semiconductor substrate is held on a sample stage in a reactor chamber of a plasma processing apparatus and a material gas containing $C_5F_8$, $C_3F_6$, or $C_4F_6$ as a main component is introduced into the reactor chamber, so that a first fluorine-containing organic film having cavities at positions between the metal interconnections is deposited between the metal interconnections and on the top surfaces of the metal interconnections.

9 Claims, 5 Drawing Sheets

SEMICONDUCTOR DEVICE AND METHOD FOR FABRICATING THE SAME

BACKGROUND OF THE INVENTION

The present invention relates to a semiconductor device having cavities between metal interconnections and a method for fabricating the same.

With recent remarkable progress in semiconductor process technology, finer semiconductor elements and metal interconnections with higher integration have been pursued. With this trend toward finer size and higher integration, signal delay at metal interconnections has come to greatly influence the operation speed of semiconductor integrated circuinsorder to minimize signal delay at metal interconnections, proposed are methods for reducing the relative dielectric constant of an insulating film deposited between metal interconnections by forming cavities ($\epsilon=1.0$) in the insulating film or by using an organic film as the insulating film, as described in Japanese Laid-Open Patent Publication No. 10-233448.

Conventional semiconductor devices adopting the above methods can reduce the relative dielectric constant to some extent. However, with further achievement of finer semiconductor elements and metal interconnections with higher integration, the distance between adjacent metal interconnections is further shortened. This increases the capacitance between metal interconnections and thus inevitably causes signal delay at metal interconnections.

To avoid the above trouble, the present inventors conceived a method for reducing the relative dielectric constant of an insulating film between metal interconnections, where an insulating film made of a fluorine-containing organic film is deposited between metal interconnections using a perfluorocarbon gas such as $CF_4$ gas, $C_2F_6$ gas, $C_3F_8$ gas, and $C_4F_8$ gas and also cavities are formed in the insulating film.

However, the inventors noticed that the perfluorocarbon gases described above have a large global warming potential ($GWP_{100}$) and thus have a possibility of causing global warming due to the greenhouse effect if used in high volume in an industrial scale.

In addition, the fluorine-containing organic film deposited using any of the above perfluorocarbon gases is poor in adhesion to an underlying film due to existence of a number of free fluorine atoms in the organic film.

Moreover, the fluorine-containing organic film deposited using any of the above perfluorocarbon gases lack denseness due to existence of a number of free fluorine atoms in the film, and thus poor in mechanical strength, heat resistance, and chemical resistance.

SUMMARY OF THE INVENTION

In view of the above, the object of the present invention is allowing a fluorine-containing organic film that is superior in adhesion to an underlying film and denseness and has cavities between metal interconnections to be deposited between metal interconnections without a possibility of causing global warming.

In order to attain the above object, the first method for fabricating a semiconductor device of the present invention includes the steps of: forming a plurality of metal interconnections on a semiconductor substrate; and depositing a first fluorine-containing organic film between the plurality of metal interconnections and on top surfaces of the metal interconnections by holding the semiconductor substrate on a sample stage in a reactor chamber of a plasma processing apparatus and introducing a material gas containing $C_5F_8$, $C_3F_6$, or $C_4F_6$ as a main component into the reactor chamber, the first fluorine-containing organic film having cavities between the metal interconnections.

According to the method for fabricating a semiconductor device of the present invention, the first fluorine-containing organic film is deposited using the material gas containing $C_5F_8$, $C_3F_6$, or $C_4F_6$ that has a short atmospheric life and a small $GWP_{100}$ as a main component. Therefore, global warming is less easily caused even when the device is mass-produced in an industrial scale.

In addition, all of $C_5F_8$ gas, $C_3F_6$ gas, and $C_4F_6$ gas have carbon-to-carbon double bonds. During film formation, carbon-to-carbon double bonds are dissociated, and resultant carbon atoms are bound with free fluorine atoms. This reduces the number of free fluorine atoms in the first fluorine-containing organic film. The resultant deposited first fluorine-containing organic film is dense and improves in adhesion to an underlying film.

Moreover, since the first fluorine-containing organic film has cavities between the metal interconnections, the relative dielectric constant between the metal interconnections is lowered. This reduces signal delay at the metal interconnections.

Preferably, the method for fabricating a semiconductor device of the present invention further includes the step of: depositing a second fluorine-containing organic film having no cavities on the first fluorine-containing organic film by introducing a material gas containing $C_5F_8$, $C_3F_6$, or $C_4F_6$ as a main component into the reactor chamber.

The first fluorine-containing organic film that has cavities tends to be poor in mechanical strength. However, by depositing the second fluorine-containing organic film having no cavities on the first fluorine-containing organic film, the second fluorine-containing organic film compensates the poor mechanical strength of the first fluorine-containing organic film. Thus, compatibility between reduction in relative dielectric constant and securement of mechanical strength is attained in the interlayer insulating film composed of the first and second fluorine-containing organic films.

In the case of including the step of depositing a second fluorine-containing organic film having no cavities on the first fluorine-containing organic film, the step of depositing a first fluorine-containing organic film preferably includes the step of applying no bias voltage or applying a relatively low bias voltage to the sample stage, and the step of depositing a second fluorine-containing organic film preferably includes the step of applying a relatively high bias voltage to the sample stage.

By adopting the above steps, it is possible to form cavities in the first fluorine-containing organic film while forming no cavities in the second fluorine-containing organic film, using the same material gas.

In the case of including the step of depositing a second fluorine-containing organic film, also, a scavenger gas for scavenging fluorine atoms is preferably mixed in the material gas used in the step of depositing a second fluorine-containing organic film.

By mixing a scavenger gas, the number of fluorine ions in the plasma decreases. Therefore, in the second fluorine-containing organic film, the proportion of fluorine atoms decreases while the proportion of carbon atoms increases. The resultant second fluorine-containing organic film is superior in mechanical strength although being high in relative dielectric constant.

In the above case, the scavenger gas is preferably CO gas. This ensures scavenging of fluorine atoms generated when $C_5F_8$, $C_2F_6$, or $C_4F_6$ is changed to plasma.

In the case of including the step of depositing a second fluorine-containing organic film, preferably, the method further includes the step of densifying the second fluorine-containing organic film by exposing the second fluorine-containing organic film to plasma of a rare gas in the reactor chamber. By this step, the second fluorine-containing organic film becomes dense, and thus improves in mechanical strength, heat resistance, and chemical resistance.

In the above case, the rare gas is preferably argon gas. The reason is as follows.

Argon gas is often added to a material gas for film formation since the deposition rate improves by adding argon gas to the material gas. Therefore, by using plasma of argon gas for densifying, the same rare gas can be used for both the film formation process and the densifying process. This makes easy to perform the film formation process and the densifying process sequentially in the same reactor chamber.

In the case of densifying the second fluorine-containing organic film, the second fluorine-containing organic film is preferably exposed to the plasma of a rare gas in a state where the semiconductor substrate has moved toward a plasma generation region in the reactor chamber. This facilitates densifying of the fluorine-containing organic film.

In the method for fabricating a semiconductor device of the present invention, the step of depositing a first fluorine-containing organic film preferably includes the step of controlling a residence time of the gas used as a main component of the material gas depending on the kind of the gas so that cavities are formed.

The above process ensures deposition of the first fluorine-containing organic film having cavities between the metal interconnections.

The semiconductor device of the present invention includes: a plurality of metal interconnections formed on a semiconductor substrate; a first fluorine-containing organic film having cavities deposited between the plurality of metal interconnections and on top surfaces of the metal interconnections; and a second fluorine-containing organic film having no cavities deposited on the first fluorine-containing organic film.

According to the semiconductor device of the present invention, the second fluorine-containing organic film having no cavities deposited on the first fluorine-containing organic film compensates the poor mechanical strength of the first fluorine-containing organic film. Thus, compatibility between reduction in relative dielectric constant and securement of mechanical strength is attained in the interlayer insulating film composed of the first and second fluorine-containing organic films.

DESCRIPTION OF THE PREFERRED EMBODIMENTS

Hereinafter, an embodiment of the method for fabricating a semiconductor device of the present invention will be described. First, as a precondition, a plasma processing apparatus used for this fabrication method will be described with reference to FIG. 1.

Figure 1:
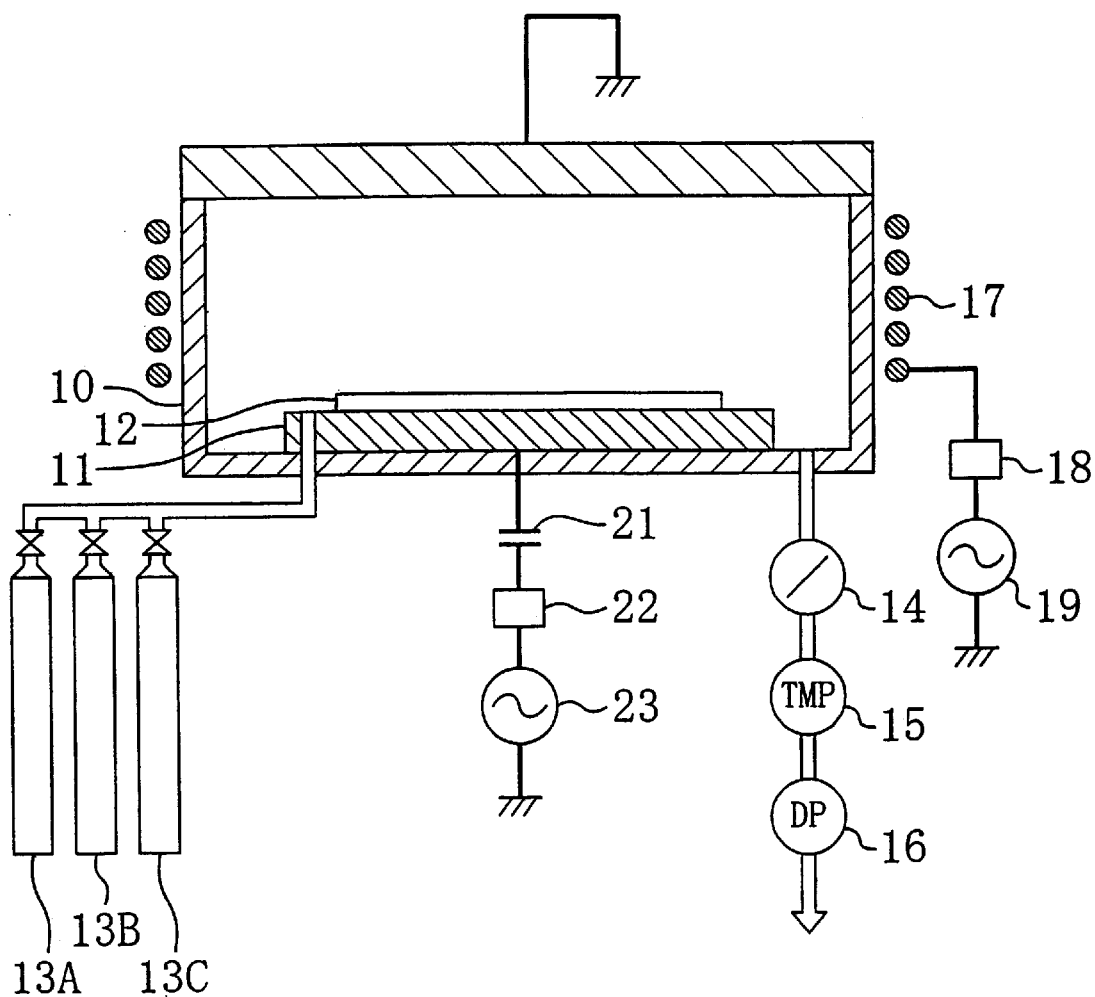
FIG. 1 is a cross-sectional view of the entire construction of an inductively coupled plasma processing apparatus used for the method for fabricating a semiconductor device of an embodiment of the present invention.

FIG. 1 is a schematic cross-sectional structure of an inductively coupled plasma processing apparatus where a bottom electrode 11 as a sample stage is disposed on the bottom of a reactor chamber 10 and holds a semiconductor substrate 12 thereon.

To the reactor chamber 10, connected are a first gas bottle 13A, a second gas bottle 13B, and a third gas bottle 13C for supply of $C_5F_8$ gas, Ar gas, and CO gas, respectively, so that $C_5F_8$ gas, Ar gas, and CO gas are introduced into the reactor chamber 10 at controlled flow rates from the first, second, and third gas bottles 13A, 13B, and 13C. The reactor chamber 10 is also provided with a gas exhaust means essentially composed of an outlet open/close valve 14, a turbo molecular pump (TMP) 15, and a dry pump (DP) 16.

A columnar coil 17 is wound around the outer circumference of a sidewall of the reactor chamber 10. An end of the columnar coil 17 is connected to a first high-frequency power source 19 via a first matching circuit 18, and the other end of the columnar coil 17 is connected to the sidewall of the reactor chamber 10 and thus grounded. Once a high-frequency power is applied to the columnar coil 17 from the first high-frequency power source 19, a high-frequency inductive electromagnetic field is generated in the reactor chamber 10, whereby the $C_5F_8$ gas, the Ar gas, and the $O_2$ gas in the reactor chamber 10 are changed to plasma. A second high-frequency power source 23 is connected to the bottom electrode 11 via a capacitor 21 and a second matching circuit 22. Once a high-frequency power is applied to the bottom electrode 11 from the second high-frequency power source 23, particles generated in the reactor chamber 10 move toward the bottom electrode 11, that is, toward the semiconductor substrate 12.

Hereinafter, an embodiment of the method for fabricating a semiconductor device of the present invention, which uses the inductively coupled plasma processing apparatus described above, will be described with reference to FIGS. 1 and 2(a) through 2(d).

Figure 2A:
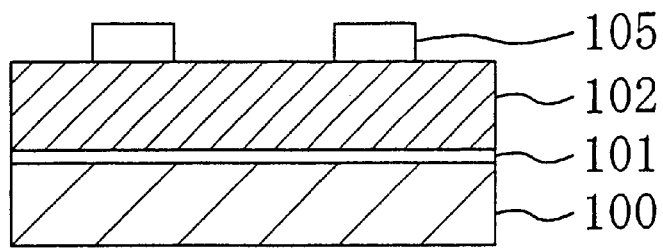
FIGS. 2(a) through 2(d) are cross-sectional views illustrating steps of the method for fabricating a semiconductor device of the embodiment of the present invention.

First, as shown in FIG. 2(a), formed sequentially on a semiconductor substrate 100 made of silicon are: a first silicon oxide film 101 made of a thermally oxidized film, for example; a metal film 102 made of aluminum or copper, for example; and a second silicon oxide film made of TEOS, for example. The second silicon oxide film is then patterned to form a hard mask 105.

Figure 2B:
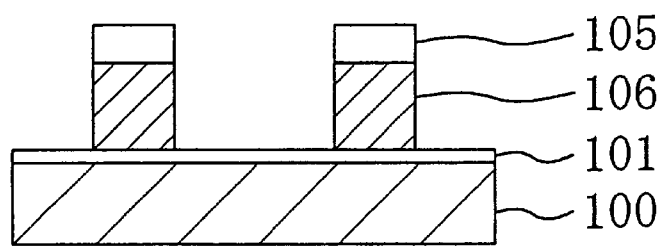
Figure 2C:
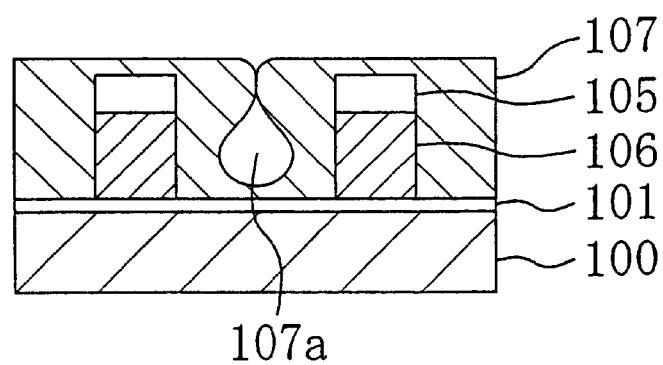

The metal film 102 is then dry-etched using the hard mask 105 as a mask, to form a plurality of metal interconnections 106 made of the metal film 102 as shown in FIG. 2(b).

Thereafter, $C_5F_8$ gas and Ar gas are supplied from the first gas bottle 13A and the second gas bottle 13B, respectively, to have a first material gas composed of the $C_5F_8$ gas and the Ar gas mixed together in the reactor chamber 10.

Simultaneously, a first high-frequency power of 400 to 3000 W having a frequency of 2.0 MHz, for example, is applied to the columnar coil 17 from the first high-frequency power source 19, to generate $C_5F_8$/Ar plasma in the reactor chamber 10. The mixture ratio of the $C_5F_8$ gas to the Ar gas is preferably in the range of 1:1 to 1:10 in volume flow rate.

As a result of the above process, a first fluorine-containing organic film 107 is formed between the plurality of metal interconnections 106 and on the top surfaces of the metal interconnections 106. The first fluorine-containing organic film 107 has a cavity 107a between the metal interconnections 106.

Preferably, a second high-frequency power (bias voltage) is not applied to the bottom electrode 12 in the process of depositing the first fluorine-containing organic film 107. Without application of the bias voltage, the force of attracting ion species in the plasma toward the semiconductor substrate 100 is weak, allowing the cavity 107a to be formed in the first fluorine-containing organic film 107.

The cavity 107a formed in the first fluorine-containing organic film 107 may become so large that the top of the cavity 107a will be exposed outside when the first fluorine-containing organic film 107 is flattened. In such a case, it is preferred to apply the second high-frequency power to the bottom electrode 12 from the second high-frequency power source 23 in the initial stage of the process of depositing the first fluorine-containing organic film 107, and stop the application of the second high-frequency power to the bottom electrode 12 after termination of the initial stage.

In the process of depositing the first fluorine-containing organic film 107, the formation of the cavity 107a in the first fluorine-containing organic film 107 is ensured if the residence time of the gas used as a main component of the material gas (in this embodiment, $C_5F_8$ gas) is controlled depending on the kind of the gas. The reason is as follows.

Molecules having a high molecular weight (high-order molecules) or radicals having a high molecular weight (high-order radicals) are low in deposition efficiency to pattern sidewalls that are sidewalls of trenches or holes, and thus tend to be easily deposited on the bottoms of trenches or holes. It is therefore difficult to form cavities in the deposited film. Contrarily, molecules having a low molecular weight (low-order molecules) or radicals having a low molecular weight (low-order radicals) are high in deposition efficiency to pattern sidewalls, and thus are easily deposited on the sidewalls of trenches or holes. It is therefore easy to form cavities in the deposited film.

In other words, cavities will be easily formed in the deposited film if dissociation of high-order molecules or high-order radicals in the plasma is facilitated to produce low-order molecules or low-order radicals.

The dissociation of high-order molecules or high-order radicals in the plasma can be facilitated by controlling the residence time of a gas to be introduced depending on the kind of the gas. The residence time of the gas is represented by $\tau(\sec)=P(Pa) \times V(m^3)/Q$ ($Pa \cdot m^3/sec$) wherein P denotes the pressure of the gas, V denotes the volume of the reactor chamber, and Q denotes the flow rate of the gas.

In the case where the main component of the material gas is $C_5F_8$ gas, if the residence time $\tau$ of the $C_5F_8$ gas in the plasma is long, a sufficient time is secured for dissociation of high-order molecules to produce low-order molecules. This increases the deposition efficiency of ion species to pattern sidewalls, and thus ensures formation of cavities in the deposited film. The residence time $\tau$ of the $C_5F_8$ gas may be lengthened by increasing the pressure P of the gas and/or decreasing the flow rate Q of the gas as is understood from the equation above. Although control of the volume V of the reactor chamber is not possible, it is advantageous to use a reactor chamber having a large volume.

Increase in the number of low-order molecules is attained by lengthening the residence time in the case of using $C_5F_8$ gas as a main component of the material gas as described above. Contrarily, increase in the number of low-order molecules is attained by shortening the residence time in the case of using $C_2F_6$ gas as a main component of the material gas. In the case of using $C_3F_6$ gas as a main component of the material gas, increase in the number of low-order molecules is attained when the residence time is about in the middle of the optimum residence times for $C_5F_8$ gas and $C_2F_6$ gas.

As described above, the cavity 107a can be formed in the first fluorine-containing organic film 107 by adopting any of the method where no bias voltage is applied to the bottom electrode 12 and the method where the resident time of the gas as a main component is optimized depending on the kind of the gas. As another method, the gas pressure may be increased, or the high-frequency power applied to the columnar coil may be increased, to increase the plasma density (that is, electron density). This increases the deposition efficiency of ion species to pattern sidewalls.

Thereafter, $C_5F_8$ gas, Ar gas, and CO gas are supplied from the first gas bottle 13A, the second gas bottle 13B, and the third gas bottle 13C, respectively, to have a second material gas composed of the $C_5F_8$ gas, the Ar gas, and the Co gas mixed together in the reactor chamber 10. Simultaneously, the first high-frequency power of 400 to 3000 W having a frequency of 2.0 MHz, for example, is applied to the columnar coil 17 from the first high-frequency power source 19, to generate $C_5F_8$/Ar/CO plasma in the reactor chamber 10. The mixture ratio of the $C_5F_8$ gas to the Ar gas is preferably in the range of 1:1 to 1:10 in volume flow rate. The CO gas functions as a scavenger gas for scavenging (physically adsorbing and chemically reacting with) fluorine in the plasma. The mixture proportion of the CO gas will be described later.

Figure 2D:
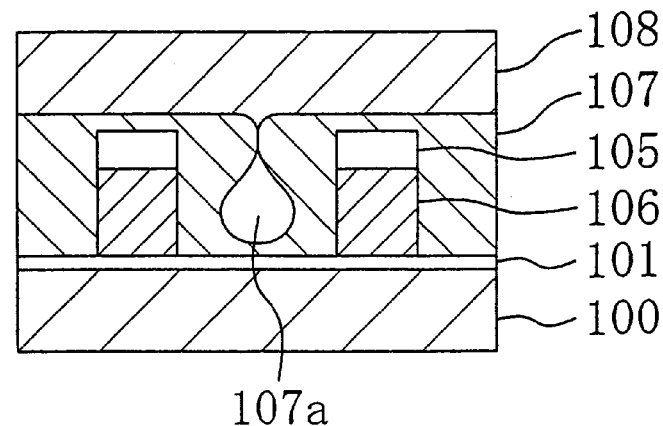

The second high-frequency power of 0 to 7.0 $W/cm^2$ having a frequency of 1.8 MHz, for example, is applied to the bottom electrode 12 from the second high-frequency power source 23, to deposit a second fluorine-containing organic film 108 having no cavities over the entire surface of the first fluorine-containing organic film 107 as shown in FIG. 2(d).

In the process of depositing the second fluorine-containing organic film 108, the second high-frequency power is applied to the bottom electrode 12 from the second high-frequency power source 23, to intensify the force of attracting ion species in the plasma toward the semiconductor substrate 100. This ensures deposition of the second fluorine-containing organic film 108 having no cavities. Note that the second fluorine-containing organic film 108 having no cavities can also be deposited without application of the second high-frequency power to the bottom electrode 12 depending on other conditions for the deposition of the second fluorine-containing organic film 108.

The second material gas contains CO gas as a scavenger gas for scavenging fluorine in the plasma. In the $C_5F_8$/Ar/CO plasma, therefore, CO ions react with fluorine (F) ions liberated from $C_5F_8$ to form COF. Thus, the number of fluorine ions in the plasma of the second material gas is smaller than the number of fluorine ions in the plasma of the first material gas. As a result, the second fluorine-containing organic film 108 deposited using the second material gas is superior in mechanical strength to the first fluorine-containing organic film 107 deposited using the first material gas, although the relative dielectric constant of the former is higher than that of the latter.

Figure 3:
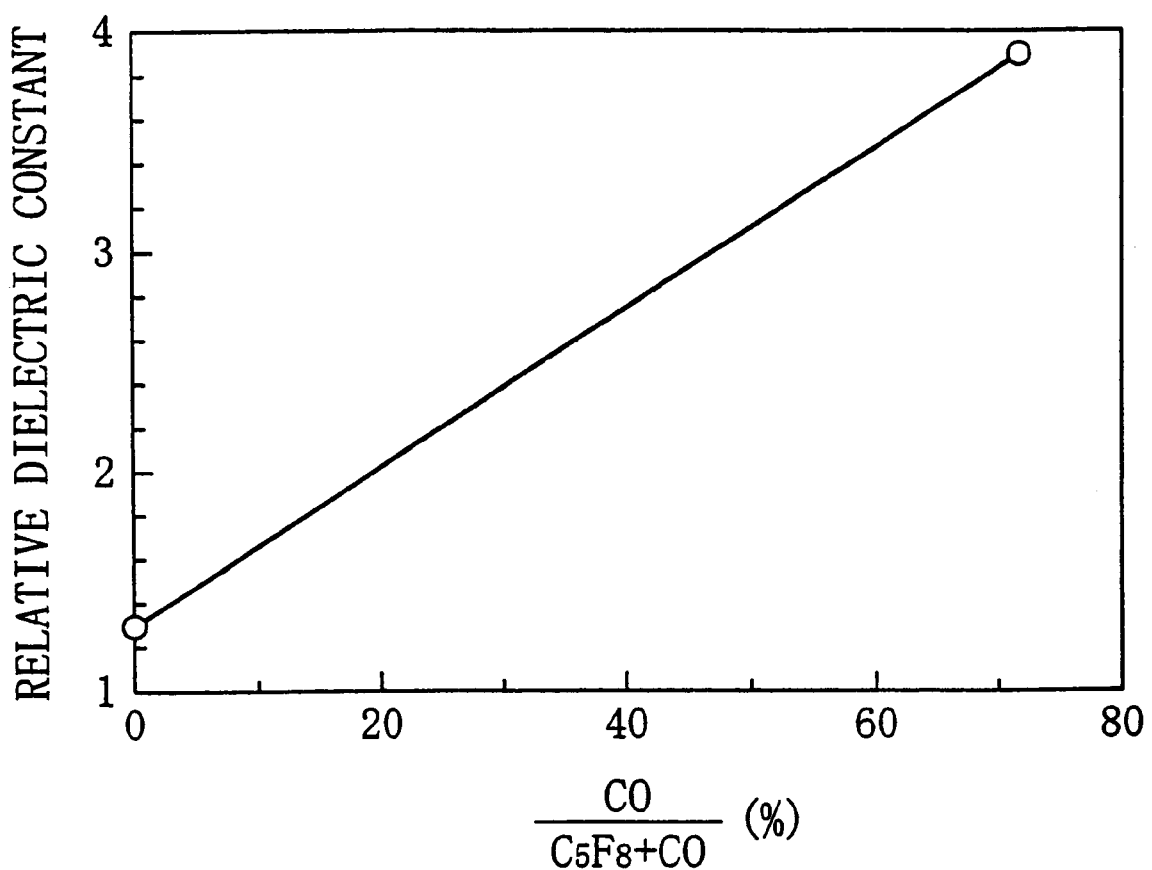
FIG. 3 is a view showing the relationship between the mixture proportion of CO gas in a total amount of $C_5F_8$ gas and CO gas in a material gas for deposition of a fluorine-containing organic film and the relative dielectric constant.

FIG. 3 shows the relationship between the mixture proportion of CO gas in a total amount of $C_5F_8$ gas and CO gas and the relative dielectric constant. As is found from FIG. 3, as the mixture proportion of CO gas is greater, the number of fluorine ions scavenged increases, which decreases the number of fluorine atoms taken in for formation of the fluorine-containing organic film, and thus the relative dielectric constant of the resultant fluorine-containing organic film is higher. The content of fluorine atoms in the fluorine-containing organic film and the mechanical strength are in the trade-off relationship. With decrease of the proportion of fluorine atoms in the film, the proportion of carbon atoms increases and thus the mechanical strength increases.

In this embodiment, CO gas is mixed in the second material gas. Alternatively, CO gas may not be mixed, or $H_2$ gas or the like may be used in place of CO gas.

Subsequently, the supply of the $C_5F_8$ gas from the first gas bottle 13A and the CO gas from the third gas bottle 13C is stopped, while the supply of the Ar gas from the second gas bottle 13B is continued. Simultaneously, the first high-frequency power of 400 to 3000 W having a frequency of 2.0 MHz, for example, is applied to the columnar coil 17 from the first high-frequency power source 19, and the second high-frequency power of 0 to 7.0 W/cm$^2$ having a frequency of 1.8 MHz, for example, is applied to the bottom electrode 12 from the second high-frequency power source 23. In this way, the second fluorine-containing organic film 108 is exposed to Ar plasma. The amount of the Ar gas supplied is not specified, but is preferably about 180 mL/min as the volume flow rate per minute in the standard conditions.

By being exposed to Ar plasma, the second fluorine-containing organic film 108 is heated with radiant heat of the plasma, raising the temperature to as high as about 300° C. By keeping the temperature of about 300° C. for about 30 seconds, the second fluorine-containing organic film 108 is densified, and thus improves in mechanical strength, heat resistance, chemical resistance, and the like. As the plasma used for densifying the second fluorine-containing organic film 108, plasma of another rare gas such as He gas may be used in place of the Ar plasma.

Figure 4A:
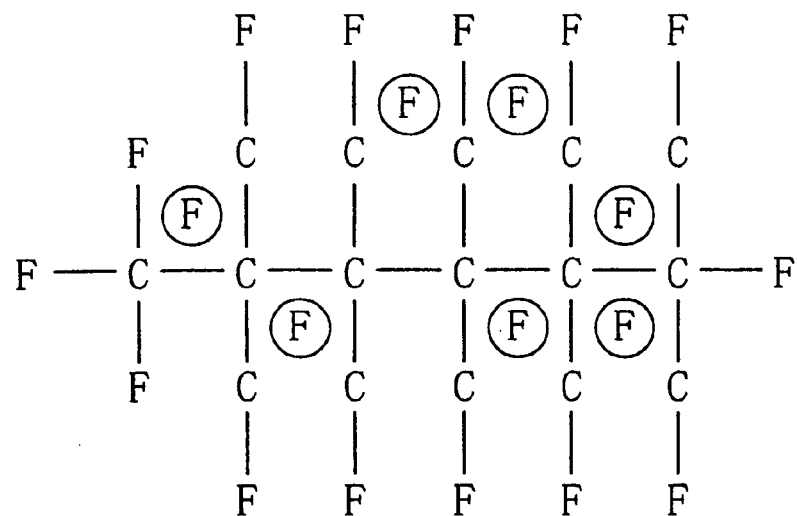
FIGS. 4(a) and 4(b) are views illustrating polymer structures of a fluorine-containing organic film before and after exposure to plasma, respectively.
Figure 4B:
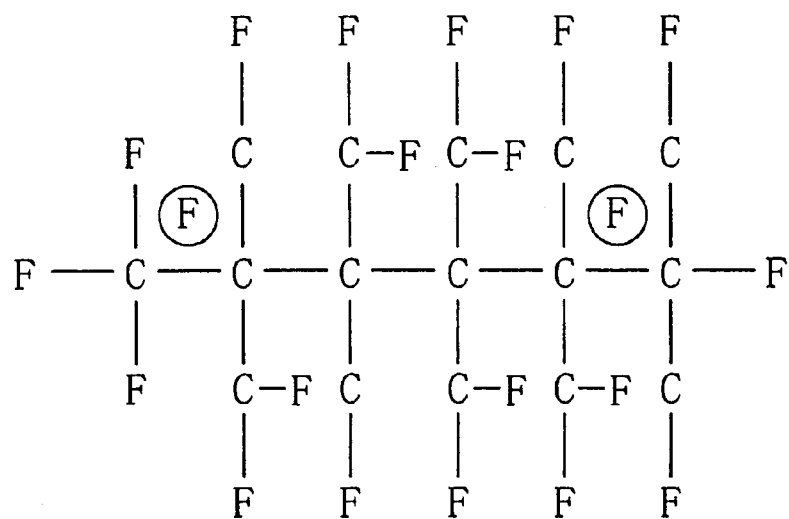

FIGS. 4(a) and 4(b) illustrate polymer structures of a fluorine-containing organic film before and after exposure to Ar plasma, respectively. As is apparent from comparison between FIGS. 4(a) and 4(b), when a fluorine-containing organic film is exposed to Ar plasma, the temperature of the fluorine-containing organic film rises, allowing free fluorine atoms existing in the polymer structure to be bound with carbon atoms. This reduces the number of free fluorine atoms and thus densities the second fluorine-containing organic film 108.

In this embodiment, as a material gas for deposition of the first and second fluorine-containing organic films 107 and 108, $C_3F_6$ gas or $C_4F_6$ gas may be used in place of $C_5F_8$ gas.

The reason why $C_5F_8$ gas, $C_3F_6$ gas, and $C_4F_6$ gas are preferable as a material gas for deposition of the first and second fluorine-containing organic films 107 and 108 is as follows.

The first reason is that these gases less easily cause global warming compared with other perfluorocarbon gases. Table 1 below shows the relationships of various gases with the atmospheric life and the GWP$_{100}$ (value obtained by quantifying the warming ability over 100 years of a gas with respect to that of carbon dioxide as 1).

TABLE 1

| Kind of gas | Formula | Atmospheric life (year) | GWP$_{100}$ |
|---|---|---|---|
| Carbon dioxide | $CO_2$ | 170 | 1 |
| Tetrafluoromethane | $CF_4$ | 50000 | 6500 |
| Hexafluoroethane | $C_2F_6$ | 10000 | 9200 |
| Trifluoromethane | $CHF_3$ | 250 | 12100 |
| Octafluoropropane | $C_3F_8$ | 2600 | 7000 |
| Octafluorocyclobutane | $C_4F_8$ | 3200 | 8700 |
| Octafluorocyclopentene | $C_5F_8$ | 1 | 90 |
| Hexafluoropropene | $C_3F_6$ | less than 1 | less than 100 (estimation) |
| Hexafluoropropane | $C_4F_6$ | less than 1 | less than 100 (estimation) |

As is found from Table 1, $C_5F_8$ gas, $C_3F_6$ gas, and $C_4F_6$ gas are short in atmospheric life and small in GWP$_{100}$, and therefore less easily cause global warming, compared with other perfluorocarbon gases.

The second reason is as follows. All of $C_5F_8$ gas, $C_3F_6$ gas, and $C_4F_6$ gas have carbon-to-carbon double bonds. During film formation, carbon-to-carbon double bonds are dissociated, and resultant carbon atoms are bound with free fluorine atoms. This reduces the number of free fluorine atoms in the first and second fluorine-containing organic films 107 and 108. The resultant deposited first and second fluorine-containing organic films 107 and 108 are dense and improve in adhesion to an underlying film.

As a material gas for depositing the first and second fluorine-containing organic films 107, $C_5F_8$ gas is preferable to other perfluorocarbon gases such as $C_2F_6$ gas and $C_4F_8$ gas for the following reason. The fluorine-containing organic film deposited using $C_5F_8$ gas is small in relative dielectric constant compared with a fluorine-containing organic film deposited using any of other perfluorocarbon gases, as described below in detail.

Figure 5:
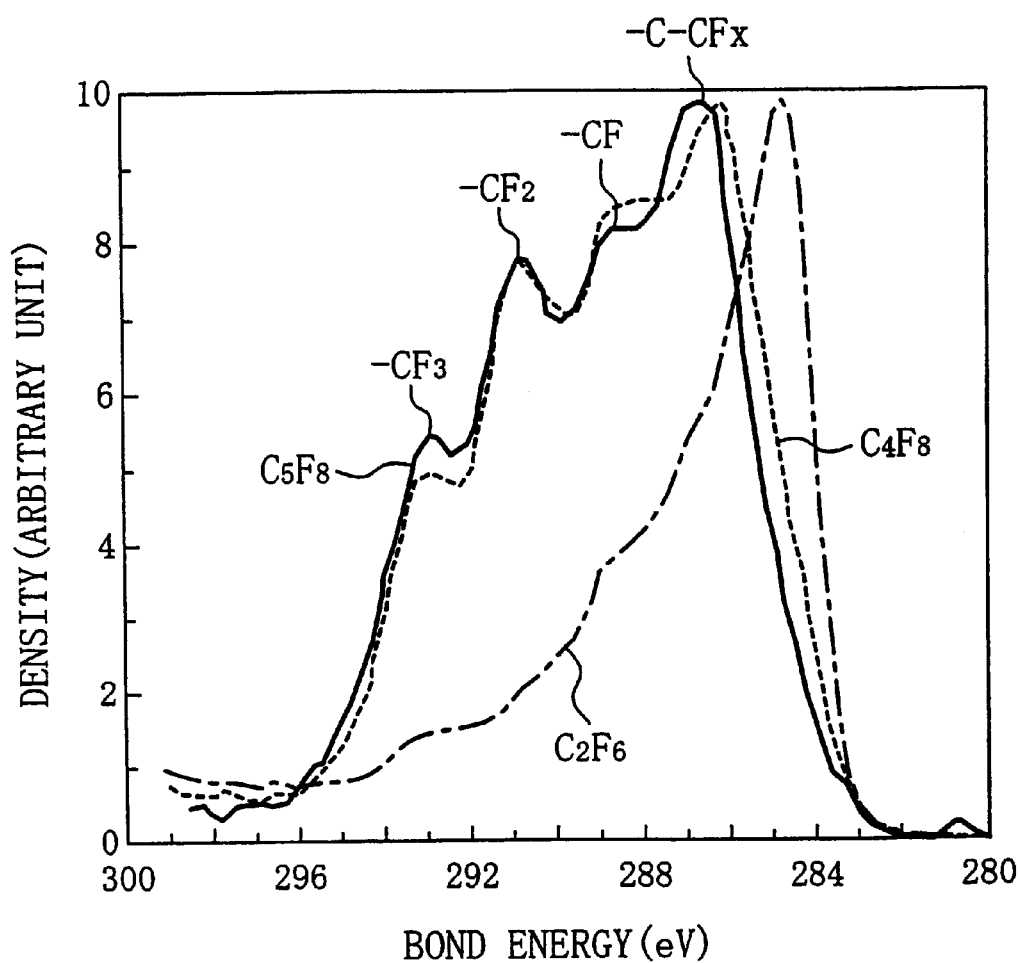
FIG. 5 is a view showing the XPS measurement results of fluorine-containing organic films deposited using $C_5F_8$ gas, $C_2F_6$ gas, and $C_4F_8$ gas.

FIG. 5 shows the results of XPS measurement of fluorine-containing organic films deposited using $C_5F_8$ gas, $C_2F_6$ gas, and $C_4F_8$ gas. From FIG. 5, it is confirmed that the amount of fluorine atoms contained in the fluorine-containing organic film deposited using $C_5F_8$ gas is larger than that in the fluorine-containing organic film deposited using $C_2F_6$ gas or $C_4F_8$ gas.

The reason why the number of fluorine atoms is large in the film formed using $C_5F_8$ gas is as follows. $C_5F_8$ gas has a large gas molecular weight. Therefore, when plasma is generated using $C_5F_8$ gas, the number of fluorine atoms in a $C_xF_y$ molecule constituting the resultant organic film is large.

For example, in comparison between $C_2F_6$ gas and $C_5F_8$ gas, $C_2F_6$ and $C_5F_8$ dissociate as follows.

$C_2F_6 \rightarrow C_2F_5\downarrow + F\uparrow$ $C_5F_8 \rightarrow C_5F_7\downarrow + F\uparrow$

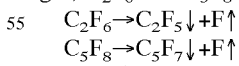

$C_2F_5$ and $C_5F_7$ constitute organic films. Therefore, naturally, the film formed by deposition of $C_5F_7$ contains a larger amount of fluorine atoms than the film formed by deposition of $C_2F_5$.

Accordingly, the interlayer insulating film formed of the first fluorine-containing organic film 107 deposited using $C_5F_8$ gas is smaller in capacitance between interconnections than an interlayer insulating film formed of a fluorine-containing organic film deposited using any of other perfluorocarbon gases. This reduces wiring delay at the metal interconnections 106.

In this embodiment, the temperature of the bottom electrode 11 was not specified in particular. During deposition, however, if the temperature of the bottom electrode 11 is lowered to reduce the temperature of the semiconductor substrate 100, the deposition rate increases. With an increased deposition rate, the first and second fluorine-containing organic films 107 and 107 can be formed efficiently. Therefore, in the process of depositing the first and second fluorine-containing organic films 107 and 108, the bottom electrode 11 is preferably cooled to keep the semiconductor substrate 100 at a low temperature.

However, when the semiconductor substrate 100 is kept at a low temperature, the efficiency decreases in the process of exposing the second fluorine-containing organic film 108 to Ar plasma to densify the film.

To overcome the above problem, in the process of densifying the film, upthrust pins (not shown) normally provided for the bottom electrode 11 are preferably thrust up to lift the semiconductor substrate 100 held on the bottom electrode 11 by about several centimeters from the bottom electrode 11. By this lifting, the semiconductor substrate 100 is detached from the cooled bottom electrode 11 and at the same time pushed closer to a plasma generation region. In this way, the second fluorine-containing organic film 108 can be obtained efficiently by deposition at a low temperature, and also the resultant second fluorine-containing organic film 108 can be densified by being brought closer to the plasma generation region.

What is claimed is:

1. A method for fabricating a semiconductor device, comprising the steps of:

forming a plurality of metal interconnections on a semiconductor substrate; and depositing a first fluorine-containing organic film between the plurality of metal interconnections and on top surfaces of the metal interconnections by holding the semiconductor substrate on a sample stage in a reactor chamber of a plasma processing apparatus and introducing a material gas containing $C_5F_8$, $C_3F_6$, or $C_4F_6$ as a main component into the reactor chamber, the first fluorine-containing organic film having cavities between the metal interconnections.

2. The method for fabricating a semiconductor device of claim 1, further comprising the step of:

depositing a second fluorine-containing organic film having no cavities on the first fluorine-containing organic film by introducing a material gas containing $C_5F_8$, $C_3F_6$, or $C_4F_6$ as a main component into the reactor chamber.

3. The method for fabricating a semiconductor device of claim 2, wherein the step of depositing a first fluorine-containing organic film includes the step of applying no bias voltage or applying a relatively low bias voltage to the sample stage, and the step of depositing a second fluorine-containing organic film includes the step of applying a relatively high bias voltage to the sample stage.

4. The method for fabricating a semiconductor device of claim 2, wherein a scavenger gas for scavenging fluorine atoms is mixed in the material gas used in the step of depositing a second fluorine-containing organic film.

5. The method for fabricating a semiconductor device of claim 4, wherein the scavenger gas is CO gas.

6. The method for fabricating a semiconductor device of claim 2, further comprising the step of:

densifying the second fluorine-containing organic film by exposing the second fluorine-containing organic film to plasma of a rare gas in the reactor chamber.

7. The method for fabricating a semiconductor device of claim 6, wherein the rare gas is argon gas.

8. The method for fabricating a semiconductor device of claim 6, wherein the step of densifying the second fluorine-containing organic film includes the step of exposing the second fluorine-containing organic film to the plasma of a rare gas in a state where the semiconductor substrate has moved toward a plasma generation region in the reactor chamber.

9. The method for fabricating a semiconductor device of claim 1, wherein the step of depositing a first fluorine-containing organic film includes the step of controlling a residence time of the gas used as a main component of the material gas depending on the kind of the gas so that cavities are formed between the plurality of metal interconnections.

* * * * *

UNITED STATES PATENT AND TRADEMARK OFFICE
CERTIFICATE OF CORRECTION

PATENT NO.    : 6,518,169 B1
DATED         : February 11, 2003
INVENTOR(S)   : Nobuhiro Jiwari and Shinichi Imai It is certified that error appears in the above-identified patent and that said Letters Patent is hereby corrected as shown below:

<u>Title page,</u>
Item [30], Foreign Application Priority Data, delete "Nov. 12, 1999" add -- Nov. 10, 1999 --
Item [73], Assignee, delete "co." add -- Co. --

Signed and Sealed this

Second Day of December, 2003

JAMES E. ROGAN
*Director of the United States Patent and Trademark Office*